(12) United States Patent
Lauchner et al.

(10) Patent No.: US 6,877,926 B2
(45) Date of Patent: Apr. 12, 2005

(54) SLIDE MEMBER POSITIVE COUPLING ALIGNMENT ASSEMBLY

(75) Inventors: Craig Lauchner, Mountain View, CA (US); Robert Hintz, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/241,330

(22) Filed: Sep. 10, 2002

(65) Prior Publication Data
US 2004/0047681 A1 Mar. 11, 2004

(51) Int. Cl.$^7$ .................................................. F16D 1/00
(52) U.S. Cl. ........................................ 403/13; 403/14
(58) Field of Search ...................... 403/13, 14, 109.1, 403/109.2, 109.3, 109.4, 109.5, 363, 315, 316, 317, 326, 327, 377, 279, 282

(56) References Cited

U.S. PATENT DOCUMENTS

| 4,417,373 | A | * | 11/1983 | Keglewitsch | ............ 403/363 X |
| 5,662,427 | A | * | 9/1997 | Chen | ....................... 403/363 X |
| 6,543,957 | B1 | * | 4/2003 | Raspotnig | ............... 403/363 X |

* cited by examiner

Primary Examiner—John R. Cottingham

(57) ABSTRACT

A slide member positive coupling alignment assembly for preventing false installation of a first member of a slide assembly with respect to a second member of the slide assembly is disclosed. In one embodiment, the present invention is comprised of a first member of a slide assembly. A second member of a slide assembly has a removably coupled stopping portion. The stopping portion is adapted to provide a barrier with regard to the first member such that during a coupling of the first member with respect to the second member misalignment is minimized.

14 Claims, 6 Drawing Sheets

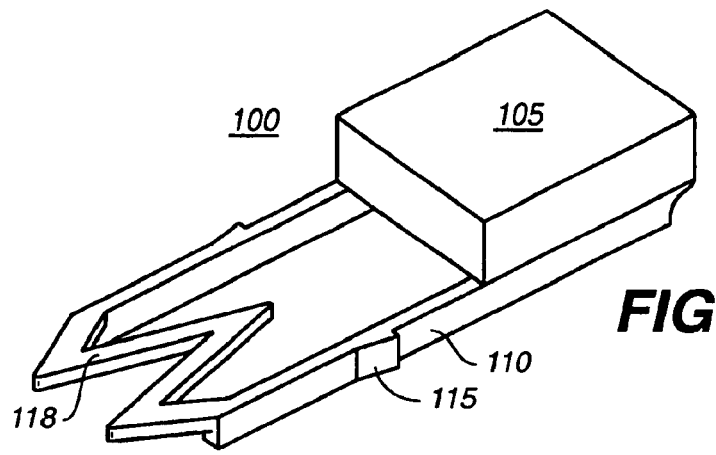
FIG._1A
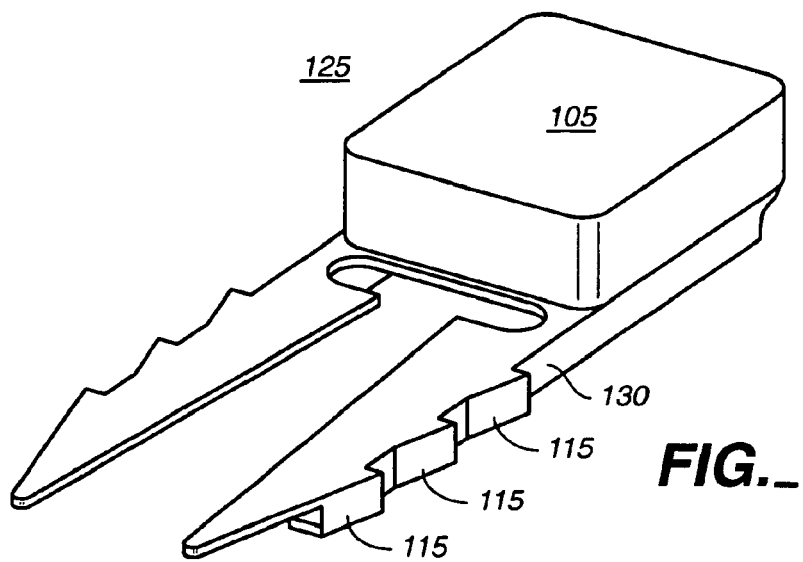
FIG._1B
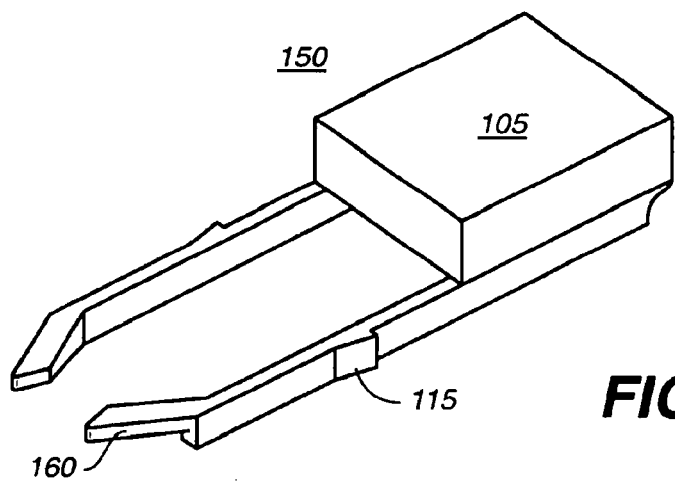
FIG._1C

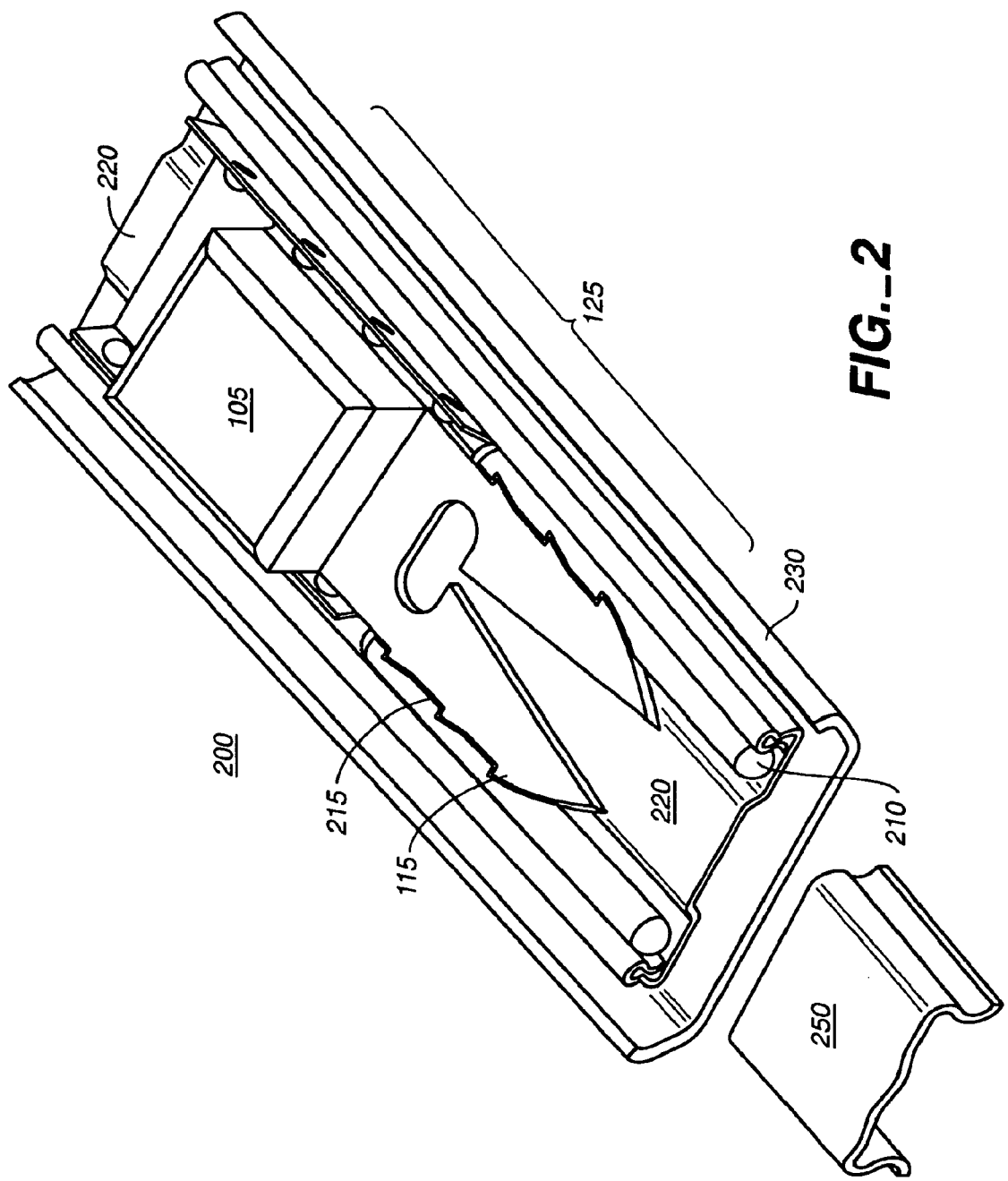
FIG._2

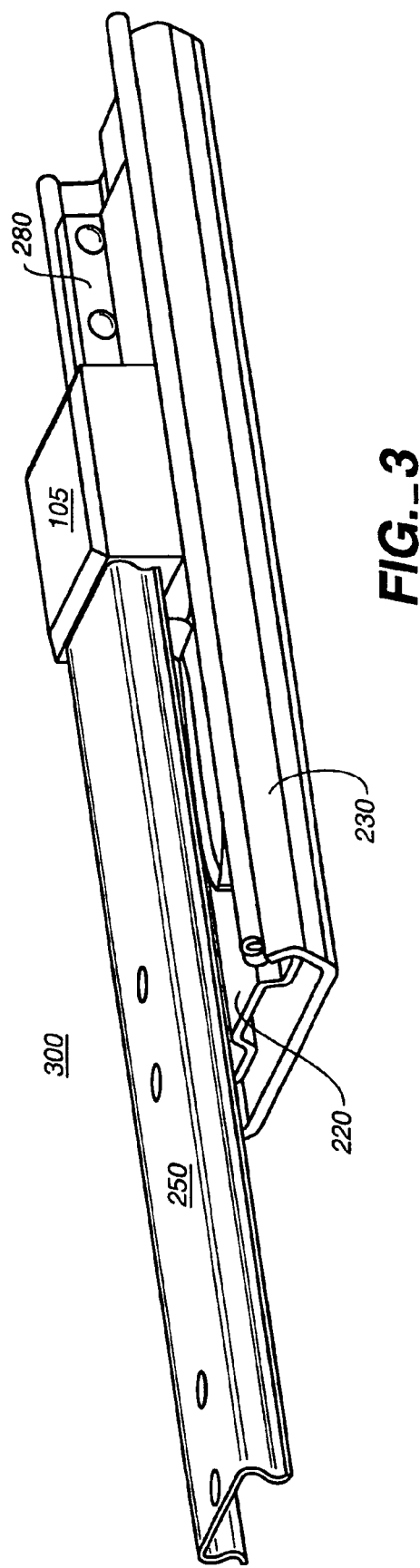
FIG._3

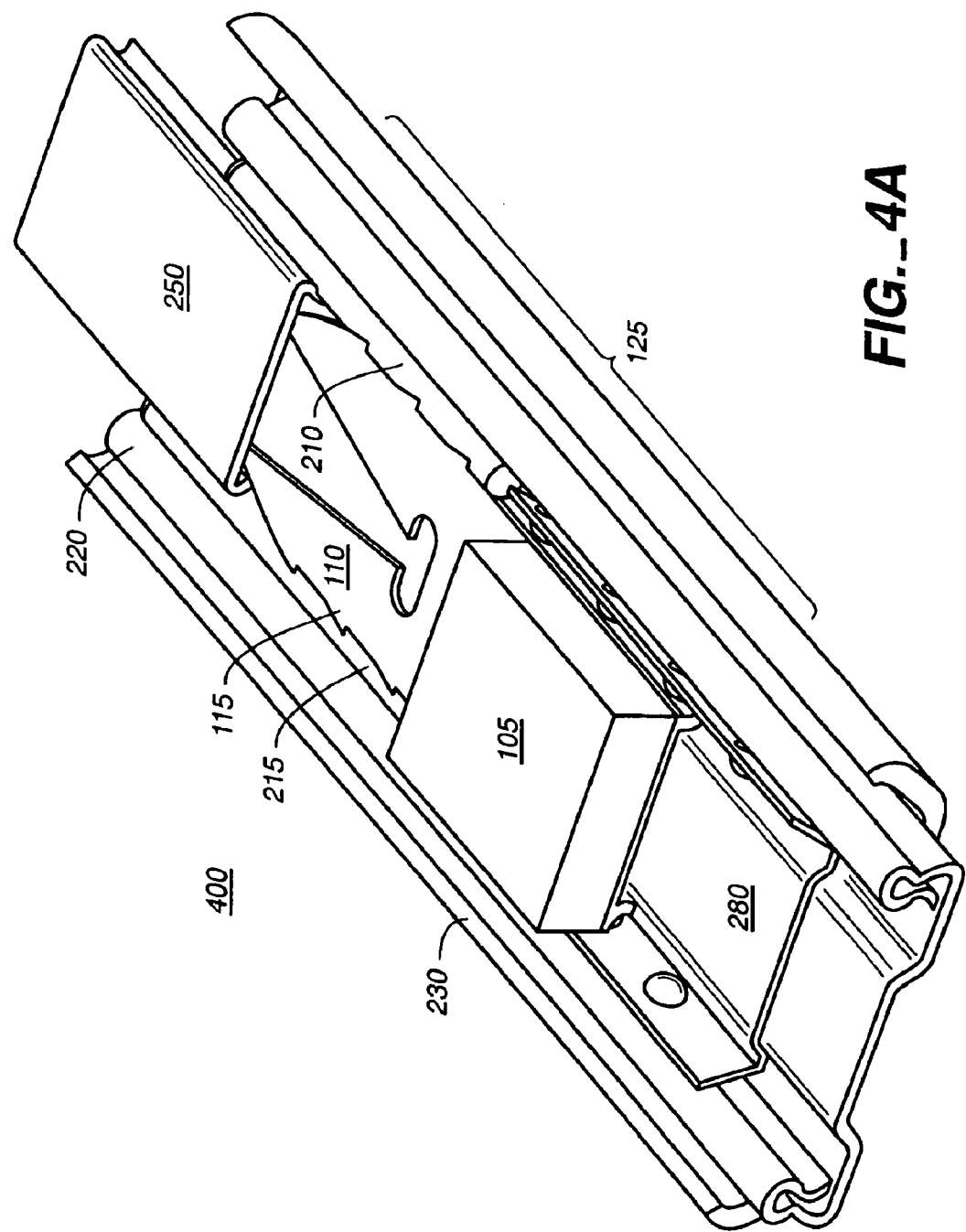
FIG._4A

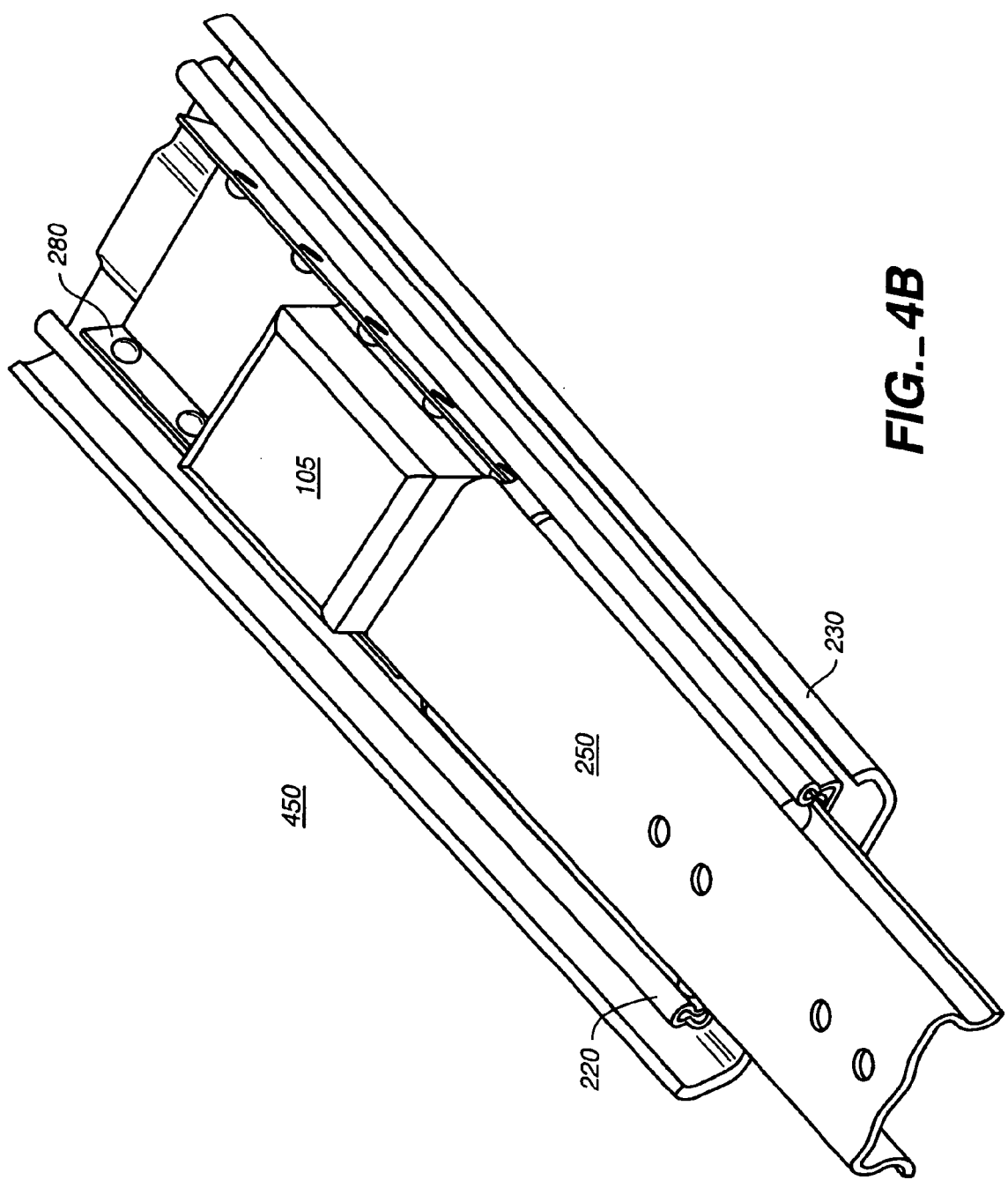
FIG._4B

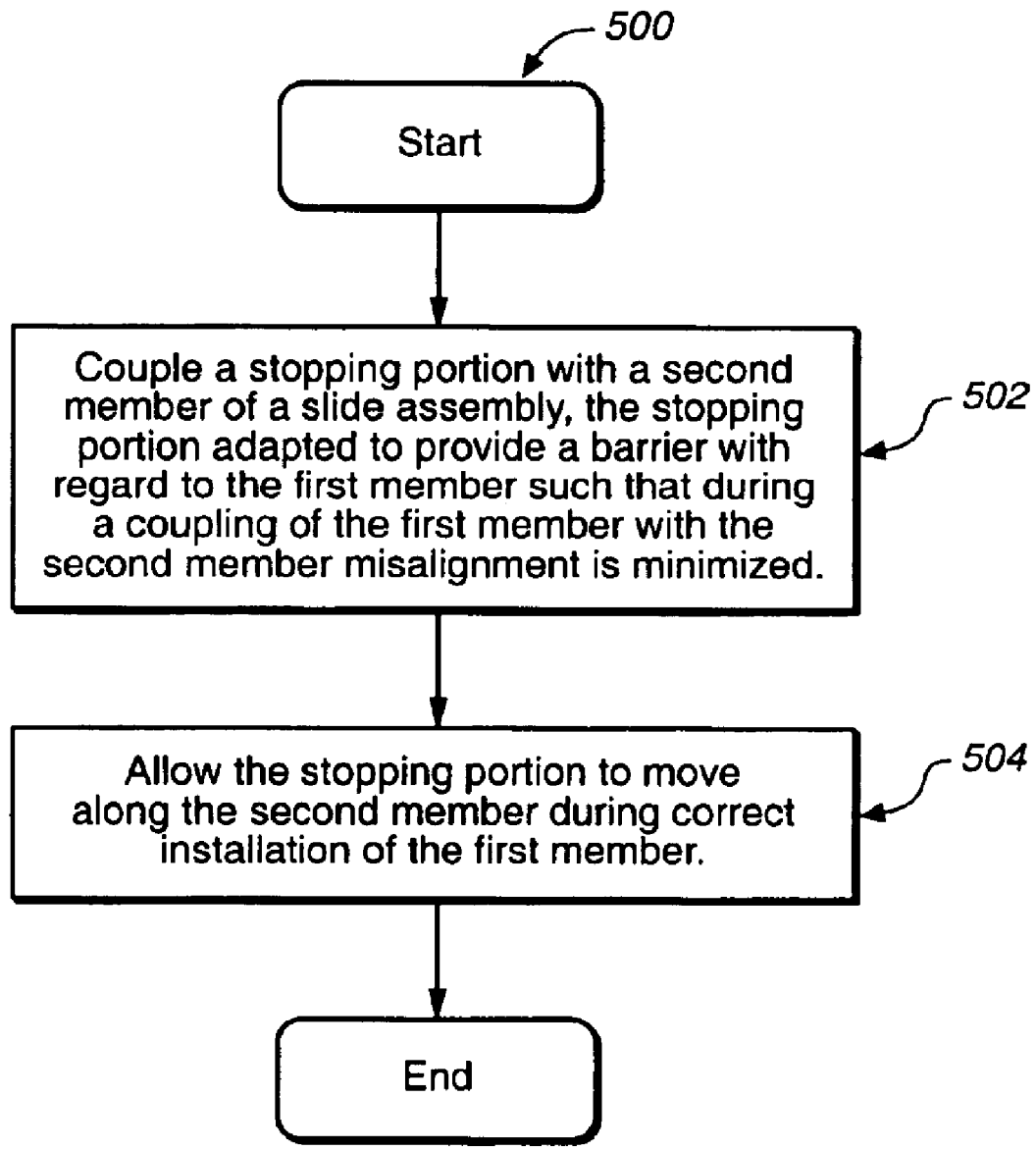
FIG. _ 5

SLIDE MEMBER POSITIVE COUPLING ALIGNMENT ASSEMBLY

TECHNICAL FIELD

The present claimed invention relates to the field of slide assemblies. More specifically, the present claimed invention relates to alignment of a slide assembly.

BACKGROUND ART

Presently, slide assemblies are utilized as the mounting hardware between a component and a rack within which the component may be stored. For example, if the component is an electronic component such as a server, then the use of a rack allows for a plurality of servers to be utilized with efficiency of storage, and convenience of accessibility. In many cases, the rack may have a back panel to which the electronic components can connect. Thereby allowing the components to receive their power connections, network connections, phone connections, and the like.

In general, the use of slide assemblies allows for a simple way to hold a component or plurality of components within the rack which also offers convenient access. For example, when a slide assembly is used then the component may be slid completely into the rack during normal function and slid partially out of the rack for maintenance. Therefore, once the component is mounted within the rack, there is no need to remove the component from the rack. This type of slide assembly becomes very useful when the component is heavy, cumbersome, fragile, or the like. For example, if the component is a server which is extremely heavy, then instead of two or more technicians or power assisting machinery being required to perform routine maintenance on the server, a lone technician may simply slide the server partially out of the rack thereby gaining access to the server while allowing the rack to support the weight.

When a component is initially prepared to be mounted on the rack, the inner most slide member may be mounted to the component. The inner most slide member and the component may then be positioned for insertion into the desired outer member of the slide assembly which has been mounted to the rack. The component and inner slide are then integrated with the rest of the telescoping slide assembly and the weight of the component is supported by the rack.

However, one deleterious effect of utilizing a slide assembly in conjunction with a rack is the possibility of the incorrect alignment of the slide assembly during the mounting of the component within the rack. Specifically, the difference between a correctly aligned inner slide and an incorrectly aligned inner slide may be as little as three-eighths of an inch. This distance is negligible when the mass and shape of the component being mounted are taken into account. For example, if the component is two feet wide and weighs 50 pounds, three-eighths of an inch may be imperceptible to the person mounting the component. Furthermore, an installer usually stands in front of the rack and therefore may not be able to see that the inner slide isn't actually entering the lead-ins of the intermediate or outer slide, but instead fails to couple with the lead-ins. Thus, the component is not attached and the installer is not aware of that fact.

If the inner member of the slide assembly is incorrectly mounted there are a plurality of possible outcomes. The best case is the component being inserted drops onto another component within the rack and little or no damage occurs. The worst case is the component being inserted drops and causes the catastrophic destruction of any other components within the rack and even the rack itself. Such destruction may result in extreme monetary losses as well as possible injury to any personnel in the area during the time of the catastrophic failure.

Thus, during the installation process more than one person is needed to ensure correct installation is accomplished with a minimization of damage. For example, during the installation of a component, one technician may be needed to support the weight of the component and insert the component into the rack, while a second technician may be needed to correctly align the slide assemblies. Both technicians would need to work in conjunction in order not to damage the rack, the slide assembly, components already in the rack, and/or the component being placed in the rack.

Consequently, the installation process is not user friendly, is time-consuming, is easily miss-installed, is dangerous, is cost associative, and lacks a desired "Design for Usability."

DISCLOSURE OF THE INVENTION

A slide member positive coupling alignment assembly for preventing false installation of a first member of a slide assembly with respect to a second member of the slide assembly is disclosed. In one embodiment, the present invention is comprised of a first member of a slide assembly. A second member of a slide assembly has a removably coupled stopping portion. The stopping portion is adapted to provide a barrier with regard to the first member such that during a coupling of the first member with respect to the second member misalignment is minimized.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1A through 1C are perspective views of stopping portions of a slide member positive coupling alignment assembly in accordance with embodiments of the present claimed invention.

FIG. 2 is a perspective view of a slide member positive coupling alignment assembly in accordance with an embodiment of the present claimed invention.

FIG. 3 is a perspective view of an exemplary misalignment result in accordance with an embodiment of the present claimed invention.

FIGS. 4A and 4B are perspective views of a first member removably coupling with a second member of a slide member positive coupling alignment assembly in accordance with an embodiment of the present claimed invention.

FIG. 5 is a flow chart of steps performed in accordance with one embodiment of the present claimed invention.

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

With reference now to FIGS. 1A through 1C perspective views of stopping portions of slide alignment assemblies are shown in accordance with embodiments of the present claimed invention. The following discussion will begin with a detailed description of the physical characteristics of the present slide member positive coupling alignment assembly. The discussion will then contain a detailed description of the use and operation of the present slide member positive coupling alignment assembly.

Regarding the physical structure of the stopping portion of a slide member positive coupling alignment assembly, for purposes of clarity, only the top side of stopping portion (e.g., 100, 125, or 150) is shown in FIGS. 1A through 1C. The bottom portion of stopping portion (e.g., 100, 125, or 150) may be solid or hollow or combinations thereof. In one embodiment, stopping portion (e.g., 100, 125, or 150) may be removably coupled with a slide portion of a telescoping disconnecting slide assembly. Stopping portion (e.g., 100, 125, or 150) includes a stop block (or block) 105. Importantly, as will be discussed in detail below, stop block 105 is capable of stopping the motion of a first member (e.g., first member 250 of FIG. 2) if an incorrect installation occurs. Stop block 105 may be may be manufactured from materials such as plastic, nylon, stainless steel, spring steel, plated spring steel, or any material capable of retaining a shape and having spring properties.

Referring still to FIGS. 1A through 1C, stopping portion (e.g., 100, 125, or 150) also includes a runner portion (or appendage) (e.g., 110, 130 and 160) integrated with stop block 105. Runner portion (e.g., 110, 130 and 160) is ultimately employed to hold the position of stop block 105. In one embodiment, runner portion 110 of FIG. 1A is formed from plastic, nylon, metal, or the like which may utilize a spring portion 118 to maintain the outward pressure of runner portion 110. In another embodiment (e.g., FIGS. 1B and 1C), runner portion (e.g., 130 or 160) is formed from plastic, nylon, steel, spring steel, plated spring steel, or the like which does not require a spring portion 118 to maintain the outward pressure of runner portion 160. Although spring portion 118 is not shown in conjunction with the stopping portion (e.g., 125 of FIG. 1B or 150 of FIG. 1C), spring portion 118 may be utilized with stopping portion 125 or 150. In one embodiment, runner portions (e.g., 110, 130 and 160) are formed in the shape of the inner slide (e.g., first member 250 of FIG. 2). For example, runner portion (e.g., 110, 130 and 160) may have a concave surface with the same cylindrical radius as the balls held in a ball retainer (e.g., ball retainer 280). Therefore, when the inner slide is correctly inserted into the slide assembly, the runners will fit within the inner slide, which will be discussed in more detail herein.

Runner portion (e.g., 110, 130 and 160) also includes hook 115. In FIGS. 1A and 1C, only a single hook 115 per runner is shown. However, FIG. 1B shows a plurality of hooks 115. In general, hook 115 is the portion of runner portion (e.g., 110, 130 and 160) which actually maintains the position of stopping portion (e.g., 100, 125, or 150) while it is mounted within the slide assembly. In addition, although hook 115 is shown as a triangular non-barbed hook, it may be a square, oval, circle, or any shape that offers a gripping surface for maintaining the position of stopping portion (e.g., 100, 125, or 150). Further operation of stopping portion (e.g., 100, 125, or 150) will be discussed in more detail herein. It is appreciated that the thickness, length, angle, and material type of the runner portion (e.g., 110, 130 and 160) may be varied. For example, the thickness of the runner portion may be adjusted dependent on the weight requirements as defined by the load specification of the slide assembly.

With reference now to FIG. 2, a perspective view of a slide member positive coupling alignment assembly is shown in accordance with an embodiment of the present claimed invention. Regarding the physical structure of the second member of a slide assembly, for purposes of clarity, only the end of the second member (e.g., 220) is shown in FIG. 2. In one embodiment, second member 220 is a slide portion of a telescoping disconnecting slide assembly. In addition, second member 220 may be mounted to a rack, cabinet, wall, or the like. In another embodiment (as shown in FIG. 2), second member 220 may be coupled with (e.g., nested with) a third member 230. In one embodiment, third member 230 may be mounted to a rack, cabinet, wall, or the like. In that case, second member 220 may telescope thereby allowing increased access to any component mounted thereon.

As will be discussed herein in detail, in one embodiment, second member 220 includes lead-in 210. Lead-in 210 may include a cut portion 215 that is the same shape as hook 115. Therefore, when stopping portion 125 is removably coupled with second member 220, hooks 115 will fit within cut portions 215. The use of cut portions 215 for lead-in 210 adds more surfaces for hook 115 to utilize while maintaining the position of stopping portion 125. However, cut portion 215 is optional. In one embodiment, lead-in 210 may be made from acrylonitrile butadiene styrene (ABS), nylon, plastic, metal, or combinations thereof.

With reference still to FIG. 2, in one embodiment lead-in 210 is fixedly mounted in a desired position on second member 220. For example, lead-in 210 may be molded with a push through tab, holes may then be punched through second member 220, and then the push through tabs may be slid through the holes in second member 220 and swaged on the outside of the slide. In one embodiment, lead-ins 210 may have two tabs which are pushed through second member 220 and swaged on the outside. The push through tabs are employed to correctly position lead-ins 210 with respect to second member 220, such that lead-ins 210 will maintain the desired position on second member 220. Although two mounting methods are mentioned herein, it is appreciated that the mounting method may be any method (e.g., glue, end caps, or the like) which maintains the desired position of lead-ins 210.

With reference now to FIG. 3 and FIGS. 4A through 4B perspective views of an exemplary coupling process of a first member of a slide assembly removably coupling with a second member of a slide assembly are shown in accordance with embodiments of the present claimed invention. In general, FIG. 3 illustrates a misalignment between first member 250 and second member 220. While FIGS. 4A and 4B show the operation of the slide member positive coupling alignment assembly when first member 250 is correctly installed with respect to second member 220.

The following is a detailed description of the use and operation of the present slide member positive coupling alignment assembly. It is appreciated that only a portion of both first member 250 and second member 220 are shown in the present embodiments. With reference now to FIG. 3, a perspective view of an exemplary misalignment result is shown in accordance with an embodiment of the present claimed invention. Specifically, slide assembly 300 illustrates first member 250 after a misalignment (e.g., false installation) has occurred. In general, stop block 105 blocks further motion of first member 250 as it travels down the length of second member 220 and in some cases, third member 230. For example, if first member 250 goes too high and slides above the appropriate slot, it will move along second member 220 and run into stop block 105. Stop block 105 is held in place by a runner 130 which utilizes hooks 115 (which fit within steps 215 of lead-in 210) to prevent stop block 105 from moving (e.g., holding it in position) thereby causing first member 250 to stop.

In one embodiment, slide assembly 300 is utilized in conjunction with a rack and a component (e.g., a server) to be stored in the rack. For example, first member 250 may be removably coupled with the component to be stored in the rack. That is, first member 250 may be coupled to the side of the component (or the top, or the corner, or the like). In addition, second member 220 may be coupled to the rack (via mounting second member 220 directly to the rack or by mounting third member 230 to the rack and having second member 220 coupled thereon). Once second member 220 is secure in the rack and first member 250 is coupled to the component, first member 250 may then be removably coupled with second member 220 establishing a complete slide assembly.

However, the present embodiment establishes a lock for first member 250 in the case of a false installation. For example, during the initial coupling of first member 250 with second member 220, the motion of first member 250 is impeded if the installation is incorrect, thereby informing the user installing the component that an error in installation has occurred, thus, preventing the dangerous situation of incorrect alignment. In addition, the present embodiment does not require a user or technician to manually remove the stopping block if a correct installation has occurred. Instead, as shown in FIGS. 4A and 4B, and described in more detail herein, the locking mechanism of stopping block 125 is disengaged from lead-in 210.

With reference now to FIGS. 4A and 4B, perspective views of a first member removably coupling with a second member of a slide member positive coupling alignment assembly are shown. Specifically, with reference to FIG. 4A, first member 250 is correctly inserted into second member 220. Upon correct installation, first member 250 begins to slide rearward along second member 220. During the insertion, stopping (or restraining) portion 115 is partially enveloped by first member (e.g., inner slide) 250. As first member 250 travels along runner portion 130, spring portion 118 is compressed and hooks 115 begin to separate from cut portions 215. Therefore, as runner portion 130 is compressed and hooks 115 separate from the cut portions 215 of lead in 210, stopping block 125 may move backward in conjunction with first member 250. Thus, as the correct installation continues, the entire runner portion 130 may be held inside first member 250 or just a portion of runner portion 130 may be held inside first member 250.

Referring now to FIG. 4B, as first member 250 travels further down second member 220 during a correct installation, stop block 105 of stopping portion 125 also moves rearward offering minimal resistance. Therefore, first member 250 may continue to the completely installed position within slide assembly 450 without further regard for stopping portion 125.

With reference now to FIG. 5, a flow chart 500 summarizing the steps performed in accordance with one embodiment of the present invention is shown. At step 502, the present embodiment couples a stopping portion with a second member of a slide assembly. As described in detail herein, the stopping portion (e.g. block 105 and appendage 130 of FIG. 4A) is adapted to provide a barrier with regard to the first member (e.g., 250 of FIG. 4A) such that during a coupling of the first member with the second member (e.g., 220 of FIG. 4A), misalignment is minimized.

Next, at step 504, the present embodiment allows the stopping portion to move along the second member during correct installation of the first member. Beneficially, the present embodiment eliminates the possibility of unrecognized misalignment between a first member (e.g., 250 of FIG. 4A) and a second member (e.g., 220 of FIG. 4A). Instead, the present embodiment allows slide assemblies to be assembled without concern for the subsequent problems, dangers, or damages associated with slide assembly misalignment. Furthermore, the ability to mount a stopping portion (e.g., 100, 125, or 150 of FIG. 1A through 1C) and a modified lead-in (e.g., 210 of FIG. 4A) on pre-existing slide assemblies negates the need for replacement of slide assemblies already in use.

Thus, embodiments of the present invention provide a slide member positive coupling alignment assembly method and apparatus which prevents misalignment during installation. The slide member positive coupling alignment assembly method and apparatus achieves the above accomplishment and also provides a reliable feedback mechanism to a user after a misalignment occurs while also significantly reducing assembly procedures and personnel requirements. In addition, it can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A slide member positive coupling alignment assembly comprising:

a first member of a slide assembly; and a second member of a slide assembly having a removably coupled stopping portion coupled thereto, said stopping portion adapted to provide a barrier with regard to said first member such that during a coupling to a completely installed position of said first member with respect to said second member said stopping portion stops said coupling when said first member is misaligned with said first portion, and wherein said stopping portion is released from said second member to allow said coupling between said first member and said second member to said completely installed position.

2. The slide member positive coupling alignment assembly of claim 1 wherein said first member and said second member are portions of a telescoping disconnecting slide assembly.

3. The slide member positive coupling alignment assembly of claim 1 further comprising:
a lead-in fixedly coupled with said second member, said lead-in adapted to allow a grasping surface for said stopping portion.

4. The slide member positive coupling alignment assembly of claim 1 further comprising:
a third member which mounts to a rack, said third member connectively coupled with said second member.

5. The slide member positive coupling alignment assembly of claim 1 wherein said stopping portion is comprised of:
a stop block for blocking the motion of said first member during said misalignment; and
a runner portion integrated with said stop block, said runner portion adapted to hold said stop block in position during said misalignment.

6. The slide member positive coupling alignment assembly of claim 5 wherein said stop block is selected from the group of materials consisting of plastic, nylon, stainless steel, spring steel and plated spring steel.

7. The slide member positive coupling alignment assembly of claim 5 wherein said runner portion is further comprised of a hook adapted to hold said stop block in position.

8. The slide member positive coupling alignment assembly of claim 5 wherein said runner portion is formed in the shape of said first member.

9. A slide member positive coupling alignment assembly comprising:
an inner member of a slide assembly; and
an outer member of a slide assembly having a removably coupled restraining portion coupled thereto, said restraining portion adapted to provide an obstruction with regard to said inner member such that during a coupling of said inner member with respect to said outer member to a completely installed position false installation is minimized, said restraining portion comprised of:
a stop block for blocking the motion of said inner member during said false installation when said inner member and said outer member are misaligned; and
a tab portion integrated with said stop block, said tab portion adapted to hold said stop block in position during said false installation, and wherein said tab portion is released from said outer member to allow said coupling between said inner member and said outer member to said completely installed position when said inner member and said outer member are aligned.

10. The slide member positive coupling alignment assembly of claim 9 wherein said inner member and said outer member are portions of a telescoping disconnecting slide assembly.

11. The slide member positive coupling alignment assembly of claim 9 further comprising:
a lead-in fixedly coupled with said outer member, said lead-in adapted to allow a grasping surface for said removably coupled restraining portion.

12. The slide member positive coupling alignment assembly of claim 9 wherein said restraining portion is made from the group of materials consisting of plastic nylon, stainless steel, spring steel and plated spring steel.

13. The slide member positive coupling alignment assembly of claim 9 wherein said tab portion is further comprised of a hook adapted to hold said restraining portion in position.

14. The slide member positive coupling alignment assembly of claim 9 wherein said tab portion is formed in the shape of said inner slide.

* * * * *